United States Patent
Patrick et al.

(10) Patent No.: US 7,718,459 B2
(45) Date of Patent: May 18, 2010

(54) DUAL CONVERSION GAIN PIXEL USING SCHOTTKY AND OHMIC CONTACTS TO THE FLOATING DIFFUSION REGION AND METHODS OF FABRICATION AND OPERATION

(75) Inventors: Inna Patrick, Boise, ID (US); Sungkwon C. Hong, Boise, ID (US); Jeffrey A. McKee, Meridian, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 140 days.

(21) Appl. No.: 11/106,466

(22) Filed: Apr. 15, 2005

(65) Prior Publication Data

US 2006/0231875 A1    Oct. 19, 2006

(51) Int. Cl.
H01L 31/062    (2006.01)
(52) U.S. Cl. ............... 438/57; 257/233; 257/E27.13
(58) Field of Classification Search .............. 257/222, 257/225, 233, 239, E27.13; 438/48, 57; 348/308; 250/208.1
See application file for complete search history.

(56) References Cited

U.S. PATENT DOCUMENTS

| 4,479,139 A * | 10/1984 | Parrish ................. 257/226 |
| 5,680,073 A * | 10/1997 | Nathan et al. ............ 327/586 |
| 6,140,630 A | 10/2000 | Rhodes |
| 6,204,524 B1 | 3/2001 | Rhodes |
| 6,246,436 B1 * | 6/2001 | Lin et al. ................ 348/308 |
| 6,310,366 B1 | 10/2001 | Rhodes et al. |
| 6,326,652 B1 | 12/2001 | Rhodes |
| 6,333,205 B1 | 12/2001 | Rhodes |
| 6,376,868 B1 | 4/2002 | Rhodes |
| 6,407,440 B1 * | 6/2002 | Rhodes .................. 257/462 |
| 6,730,897 B2 * | 5/2004 | Guidash ................ 250/208.1 |
| 7,026,596 B2 * | 4/2006 | Fossum ................. 250/208.1 |
| 2004/0251394 A1 | 12/2004 | Rhodes et al. |
| 2004/0251482 A1 | 12/2004 | Rhodes |
| 2005/0051701 A1 * | 3/2005 | Hong .................... 250/214.1 |
| 2007/0278536 A1 * | 12/2007 | Adachi .................. 257/239 |

FOREIGN PATENT DOCUMENTS

| EP | 0 410 465 A2 | 1/1991 |
| GB | 2 330 905 A | 5/1999 |

* cited by examiner

*Primary Examiner*—Lynne A Gurley
*Assistant Examiner*—Colleen A Matthews
(74) *Attorney, Agent, or Firm*—Dickstein Shapiro LLP

(57) ABSTRACT

The exemplary embodiments provide an imager with dual conversion gain charge storage and thus, improved dynamic range. A dual conversion gain element (e.g., Schottky diode) is coupled between a floating diffusion region and a respective capacitor. The dual conversion gain element switches in the capacitance of the capacitor, in response to charge stored at the floating diffusion region, to change the conversion gain of the floating diffusion region from a first conversion gain to a second conversion gain. In an additional aspect, the exemplary embodiments provide an ohmic contact between the gate of a source follower transistor and the floating diffusion region which assists in the readout of the dual conversion gain output signal of a pixel.

12 Claims, 9 Drawing Sheets

DUAL CONVERSION GAIN PIXEL USING SCHOTTKY AND OHMIC CONTACTS TO THE FLOATING DIFFUSION REGION AND METHODS OF FABRICATION AND OPERATION

FIELD OF THE INVENTION

The invention relates generally to imaging devices and more particularly to dual conversion gain imaging devices.

BACKGROUND OF THE INVENTION

Imaging devices, including charge coupled devices (CCD) and complementary metal oxide semiconductor (CMOS) imagers, are commonly used in photo-imaging applications.

A CMOS imager circuit includes a focal plane array of pixels, each of the pixels including a photosensor, for example, a photogate, photoconductor or a photodiode for accumulating photo-generated charge a portion of the substrate. Each pixel has a charge storage region, formed on or in the substrate, which is connected to the gate of an output transistor that is part of a readout circuit. The charge storage region may be constructed as a floating diffusion region. In some imager circuits, each pixel may include at least one electronic device such as a transistor for transferring charge from the photosensor to the storage region and one device, also typically a transistor, for resetting the storage region to a predetermined charge level prior to charge transference.

In a CMOS imager, the active elements of a pixel perform the necessary functions of: (1) photon to charge conversion; (2) accumulation of image charge; (3) resetting the storage region to a known state; (4) transfer of charge to the storage region accompanied by charge amplification; (5) selection of a pixel for readout; and (6) output and amplification of a signal representing a reset level and pixel charge. Photo charge may be amplified when it moves from the initial charge accumulation region to the storage region. The charge at the storage region is typically converted to a pixel output voltage by a source follower output transistor.

CMOS imagers of the type discussed above are generally known as discussed, for example, in U.S. Pat. No. 6,140,630, U.S. Pat. No. 6,376,868, U.S. Pat. No. 6,310,366, U.S. Pat. No. 6,326,652, U.S. Pat. No. 6,204,524 and U.S. Pat. No. 6,333,205, assigned to Micron Technology, Inc., which are hereby incorporated by reference in their entirety.

A typical four transistor (4T) CMOS image pixel 10 is shown in FIG. 1. The pixel 10 includes a photosensor 12 (e.g., photodiode, photogate, etc.), transfer transistor 14, floating diffusion region FD, reset transistor 16, source follower transistor 18 and row select transistor 20. The photosensor 12 is connected to the floating diffusion region FD by the transfer transistor 14 when the transfer transistor 14 is activated by a transfer gate control signal TX.

The reset transistor 16 is connected between the floating diffusion region FD and an array pixel supply voltage Vaa_pix. A reset control signal RST is used to activate the reset transistor 16, which resets the floating diffusion region FD to the array pixel supply voltage Vaa_pix level.

The source follower transistor 18 has its gate connected to the floating diffusion region FD and is connected between the array pixel supply voltage Vaa_pix and the row select transistor 20. The source follower transistor 18 converts the charge stored at the floating diffusion region FD into electrical output voltage signals Vrst, which is produced when the floating diffusion region FD is reset, and Vsig, which is produced after charge is transferred by transistor 14 from the photosensor 12 to the floating diffusion region FD. The row select transistor 20 is controllable by a row select signal SEL for selectively connecting the source follower transistor 18 and its output voltage signal Vout to a column line 22 of a pixel array.

An important performance characteristic of any imager is its dynamic range. A large dynamic range is desirable in applications for sensing low light signals and capturing images with large variations in illuminance or brightness. In particular, the dynamic range of an imager can be defined as the ratio of the minimum illuminance the imager detects under saturation to the illuminance the imager detects at a signal-to-noise ratio (SNR) equal to one. The dynamic range of a scene can also be expressed as the ratio of its highest illumination level to its lowest illumination level.

Intrascene dynamic range refers to the range of incident signals that can be accommodated by an imager in a single frame of image data. Examples of scenes that generate high dynamic range incident signals include an indoor room with outdoor window, outdoor mixed shadow and bright sunshine, night time scenes combining artificial lighting and shadows, and in an automotive context, an automobile entering or about to leave a tunnel or shadowed area on a bright day.

FIG. 2 illustrates a block diagram of a CMOS imager device 308 having a pixel array 240 with each pixel being constructed as described above or in accordance with other known pixel architectures. Pixel array 240 comprises a plurality of pixels arranged in a predetermined number of columns and rows. The pixels of each row in array 240 are all turned on at the same time by a row select line, and the pixels of each column are selectively output by respective column select lines. A plurality of row and column lines are provided for the entire array 240. The row lines are selectively activated by the row driver 245 in response to row address decoder 255 and the column select lines are selectively activated by the column driver 260 in response to column address decoder 270. Thus, a row and column address is provided for each pixel.

The imager 308 is operated by a control circuit 250, which controls address decoders 255, 270 for selecting the appropriate row and column lines for pixel readout, and row and column driver circuitry 245, 260 which apply driving voltages to the drive transistors of the selected row and column lines. The pixel column signals, which typically include a pixel reset signal Vrst and a pixel image signal Vsig are read by sample and hold circuitry 261 associated with the column driver 260. A differential signal Vrst−Vsig is produced and amplified by a differential amplifier 262. The differential signal is digitized by an analog-to-digital converter 275. The analog-to-digital converter 275 converts the analog differential signals to digital signals that are fed to an image processor 280 to form and output a digital image.

The imager 308 is operated by a control circuit 250, which controls address decoders 255, 270 for selecting the appropriate row and column lines for pixel readout, and row and column driver circuitry 245, 260 which apply driving voltages to the drive transistors of the selected row and column lines. The pixel column signals, which typically include a pixel reset signal Vrst and a pixel image signal Vsig are read by sample and hold circuitry 261 associated with the column device 260. A differential signal Vrst−Vsig is produced and amplified by a differential amplifier 262. The differential signal is digitized by an analog-to-digital converter 275. The analog-to-digital converter 275 converts the analog differential signals to digital signals that are fed to an image processor 280 to form and output a digital image.

The illumination-voltage profile of the conventional pixel 10 (FIG. 1) for the photo-charge converted signal Vsig is typically linear as shown in FIG. 3, which illustrates an illumination versus voltage graph of the prior art pixel 10. The pixel's 10 maximum voltage $V_{max}$ may be reached at a relatively low level of illumination $I_{max}$, which causes the pixel 10 to be easily saturated. When the light captured and converted into charge by the photosensor 12 is greater than the capacity of the photosensor 12, excess charge may overflow and be transferred into the substrate and to adjacent pixels, which is undesirable. Thus, there is a desire and need for an improved saturation response in imager pixels 10 and imagers 308 in general. Improved saturation response will improve the imager's dynamic range.

BRIEF SUMMARY OF THE INVENTION

The present invention in the exemplary embodiments provides an imager with dual conversion gain charge storage and thus, improved dynamic range. A dual conversion gain element (e.g., Schottky diode) is coupled between a floating diffusion region and a respective capacitor. The dual conversion gain element switches in the capacitance of the capacitor, in response to charge stored at the floating diffusion region, to change the conversion gain of the floating diffusion region from a first conversion gain to a second conversion gain.

In an additional aspect, the invention provides in exemplary embodiments an ohmic contact between the gate of a source follower transistor and the floating diffusion region which assists in the readout of the dual conversion gain output signal of a pixel.

BRIEF DESCRIPTION OF THE DRAWINGS

These and other features and advantages of the invention will be better understood from the following detailed description, which is provided in connection with the accompanying drawings in which.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The term "substrate" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting light radiation to an electrical signal. For purposes of illustration, a representative pixel is illustrated in the figures and description herein and, typically, fabrication of all pixels in an imager array will proceed simultaneously in a similar fashion.

Figure 4:
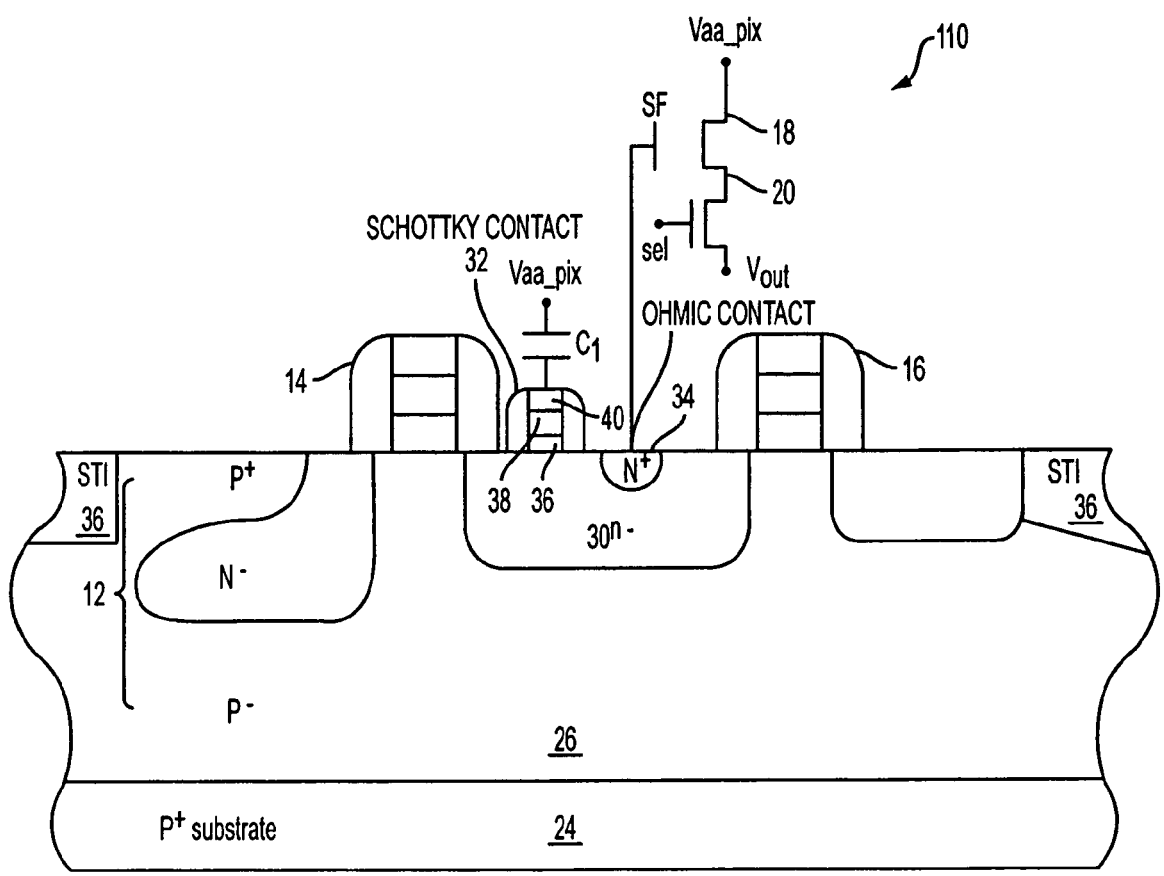
FIG. 4 illustrates an exemplary floating diffusion region in accordance with an embodiment of the invention.

As discussed below, the invention increases the storage capacity of a pixel's floating diffusion region, thereby increasing the dynamic range of the pixel. FIG. 4 illustrates a cross-section of a portion of an exemplary pixel 110 constructed in accordance with an embodiment of the invention. The pixel 110 contains a floating diffusion region 30, which receives charge from a photosensor, illustrated in FIG. 4 as a p-n-p diode, through a transfer transistor 14. A dual conversion gain switch element of the pixel 110 is formed between the floating diffusion region 30 and a capacitor C1. Preferably, the dual conversion gain switch element is a Schottky contact 32 which forms a Schottky diode. An ohmic contact 34 is formed between the floating diffusion region 30 and a source follower transistor gate 18. The ohmic contact 34 is formed by an n+ doped region 34 within the n-doped floating diffusion region. The Schottky contact 32 is formed on the n− doped floating diffusion region 30 which is in contact with a p-type layer 26. The contact 32 allows for the realization of a dual conversion gain pixel. That is, as is explained below in more detail, the pixel 110 will have a first conversion gain under a lower level of charge transferred to the floating diffusion region 30 cause by relatively lower levels of incident light and a second conversion gain under higher levels of charge transferred to the floating diffusion region 30 caused by relatively higher levels of incident light. The Schottky contact 32 creates the occurrence of a "knee" in the illumination response (see FIG. 5), where the response and the knee are determined by the barrier height of the Schottky contact 32.

Figure 1:
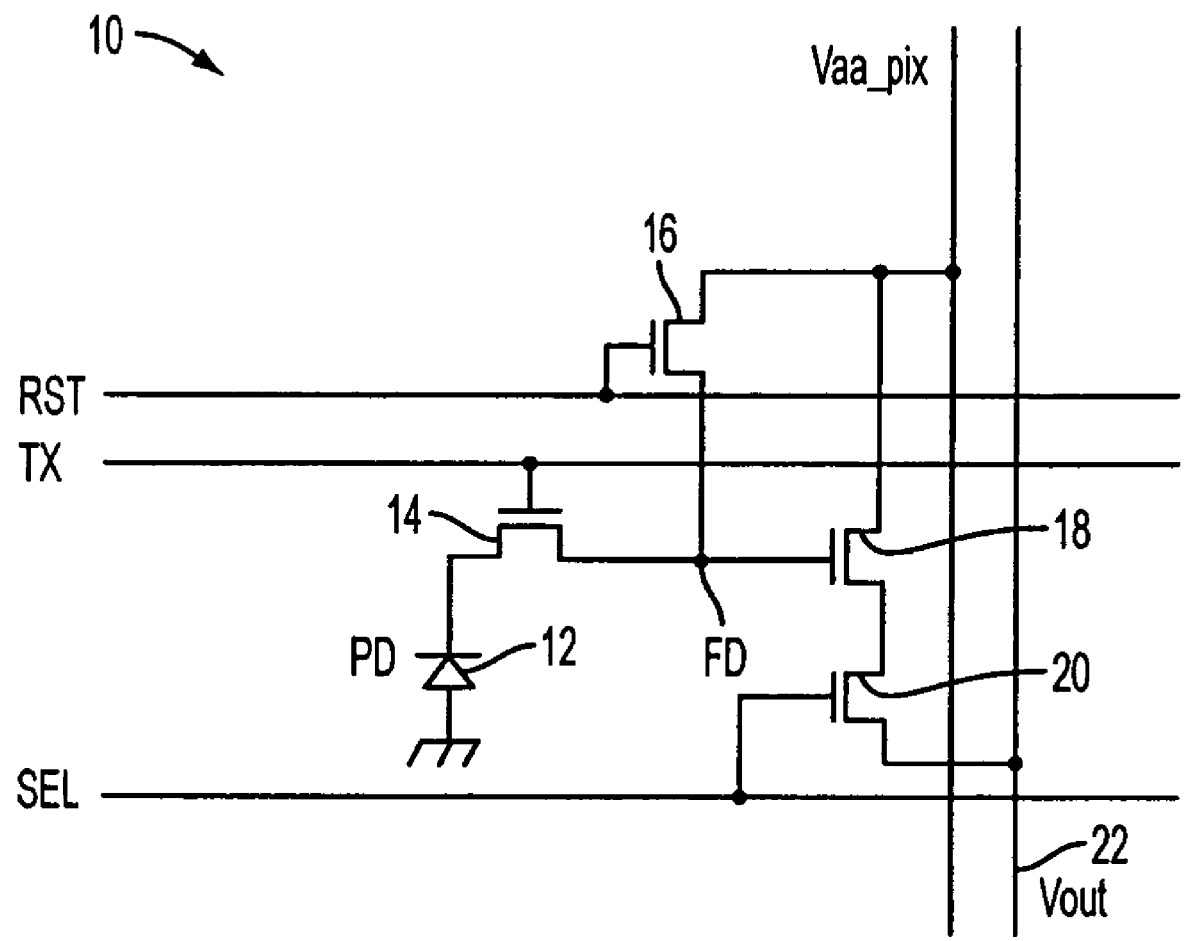
FIG. 1 is a schematic diagram of a four-transistor (4T) pixel.
Figure 7:
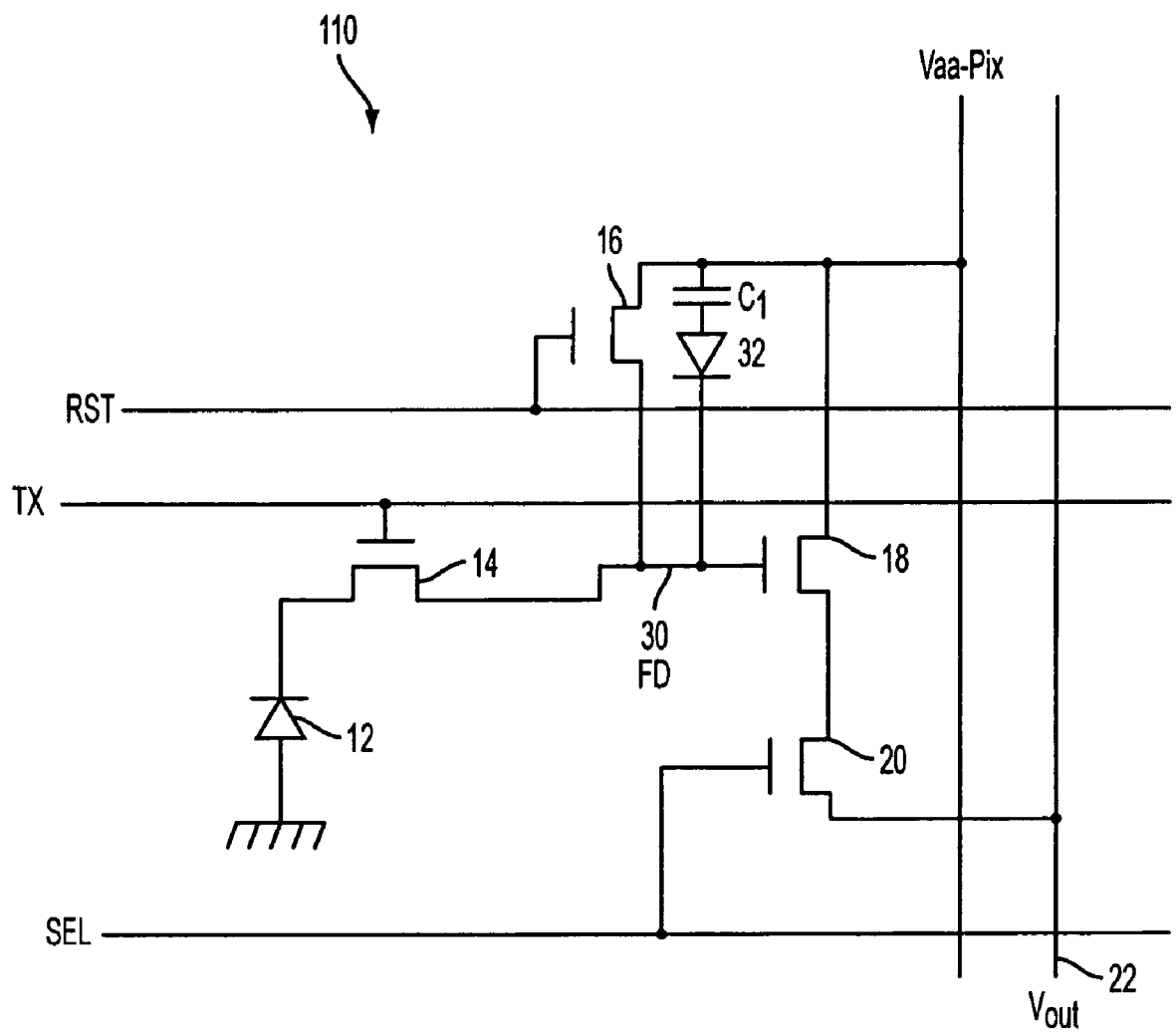
FIG. 7 illustrates an exemplary circuit diagram in accordance with an embodiment of the invention.

The remaining portions of the pixel 110 are similar to that of the pixel illustrated in FIG. 1. FIG. 7 illustrates the equivalent circuit diagram of the pixel 110 of FIG. 4. That is, the pixel 110 includes a photosensor 12 which is connected to the transfer transistor 14. The transfer transistor 14 transfers charge to the floating diffusion region 30. A reset transistor 16 is connected between the floating diffusion region 30 and an array pixel supply voltage Vaa_pix. A reset control signal RST is used to activate the reset transistor 16, which resets the floating diffusion region 30 to the array pixel supply voltage Vaa_pix level.

The source follower transistor 18 has its gate connected to the floating diffusion region 30 and is connected between the array pixel supply voltage Vaa_pix and the row select transistor 20. The source follower transistor 18 converts the charge stored at the floating diffusion region 30 into electrical output voltage signals Vrst, which is produced when the floating diffusion region 30 is reset, and Vsig, which is produced after charge is transferred by transistor 14 from the photosensor 12 to the floating diffusion region 30. The row select transistor 20 is controllable by a row select signal SEL for selectively connecting the source follower transistor 18 and its output voltage signal Vout to a column line 22 of a pixel array. The Schottky contact 32, forming a Schottky diode, is connect to the floating diffusion region 30. Once a predetermined level of charge collects in the floating diffusion region 30, the Schottky diode 32 automatically connects the capacitor C1 to the floating diffusion region 30, thereby increasing the conversion gain of the floating diffusion region 30.

The Schottky diode 32, also referred to as a barrier or contact, is formed above the floating diffusion region 30. However, although FIG. 4 illustrates that the Schottky diode 32 is formed above the floating diffusion region 30, the diode 32 may alternatively be formed within the floating diffusion region 30. The diode 32 may be formed of either pure a metal or metal silicide layer 32 when contacting the n− silicon layer 30. Exemplary metal silicide materials that may be used for the Schottky diode include tungsten (W6), cobalt silicide (CoSi2), platinum silicide (PtSi), titanium silicide (TiSi2) and tantalum silicide (TaSi2). The barrier for each of these silicides is 0.55-0.93V which must be exceed for the diode switch to activate. The material chosen for a particular application depends on the reproducibility and temperature stability of the diode based on the particular material chosen. Additionally, pure metals silver (Ag), aluminum (Al), gold (Au), chromium (Cr), hafnium (Hf), magnesium (Mg), molybdenum (Mo), nickel (Ni), palladium (Pd), platinum (Pt), titanium (Ti) and tungsten (W) may also be used to form Schottky diodes on an n-type silicon. The barrier for these metals is from about 0.5-0.9V. Several of the pure metals may also form silicides, as noted above, when the metal reacts with silicon. Although all of these materials are able to form Schottky diodes 32, several of these metals, including Au and Cu, are known to be contaminates in CMOS technology and therefore may not be as desirable for use in CMOS implementations. The invention described herein does not require a very low barrier to achieve the dual conversion gain aspect of the invention.

The Schottky diode 32, also referred to as a barrier or contact, is formed above the floating diffusion region 30. However, although FIG. 4 illustrates that the Schottky diode 32 is formed above the floating diffusion region 30, the diode 32 may alternatively be formed within the floating diffusion region 30. The diode 32 may be formed of either pure a metal or metal silicide layer 32 when contacting the n− silicon layer 30. Exemplary metal silicide materials that may be used for the Schottky diode include tungsten (W6), cobalt silicide (CoSi2), platinum silicide (PtSi) and titanium silicide (TaSi$_2$.) The barrier for each of these silicides is 0.55-0.93V which must be exceed for the diode switch to activate. The material chosen for a particular application depends on the reproducibility and temperature stability of the diode based on the particular material chosen. Additionally, pure metals silver (Ag), aluminum (Al), gold (Au), chromium (Cr), hafnium (Hf), magnesium (Mg), molybdenum (Mo), nickel (Ni), palladium (Pd), platinum (Pt), titanium (Ti) and tungsten (W) may also be used to form Schottky diodes on an n-type silicon. The barrier for these metals is from about 0.5-0.9V. Several of the pure metals may also form silicides, as noted above, when the metal reacts with silicon. Although all of these materials are able to form Schottky diodes 32, several of these metals, including Au and Cu, are known to be contaminates in CMOS technology and therefore may not be as desirable for use in CMOS implementations. The invention described herein does not require a very low barrier to achieve the dual conversion gain aspect of the invention.

Often, a conductive metal nitride layer (e.g., TiN) is used as the thin barrier layer 38 during contact 32 formation (e.g., Schottky diode formation), as shown in FIG. 4. For example, Pt-based Schottky diodes are known to result in a very low barrier and are therefore, easily reproducible diodes. Ti would result in a very low barrier on n-type silicon, however, TiSi formation at a low temperature, employed in conventional silicon processing, raises this barrier. Therefore, any one of a number of materials may be used to implement a very low Schottky diode to n-type silicon, however, the invention, described herein, does not require a very low barrier to n-type silicon. The barrier height may be adjusted by material selection or adjusting the n− doping concentration to result in a desired "knee" for the conversion gain.

Charge automatically flows through the diode 32 once the charge potential of the floating diffusion region 30 reaches a predetermined threshold potential and is stored in capacitor C1. The advantage of the Schottky diode 32 is that the step of activating a transistor to connect the floating diffusion region 30 to the capacitor C1 is unnecessary. The predetermined threshold potential is dependant on the diode 32 barrier height. Charge flowing through the diode 32 is stored in the connected capacitor C1. Capacitor C1 is also connected to the array pixel supply voltage Vaa_pix. The combination of the Schottky diode 32 and capacitor C1 allows for an increased storage capacity of the pixel 110. When the threshold potential of the diode 32 is met and charge flows into the capacitor C1, the knee in the illumination response is created (see FIG. 5).

Figure 5:
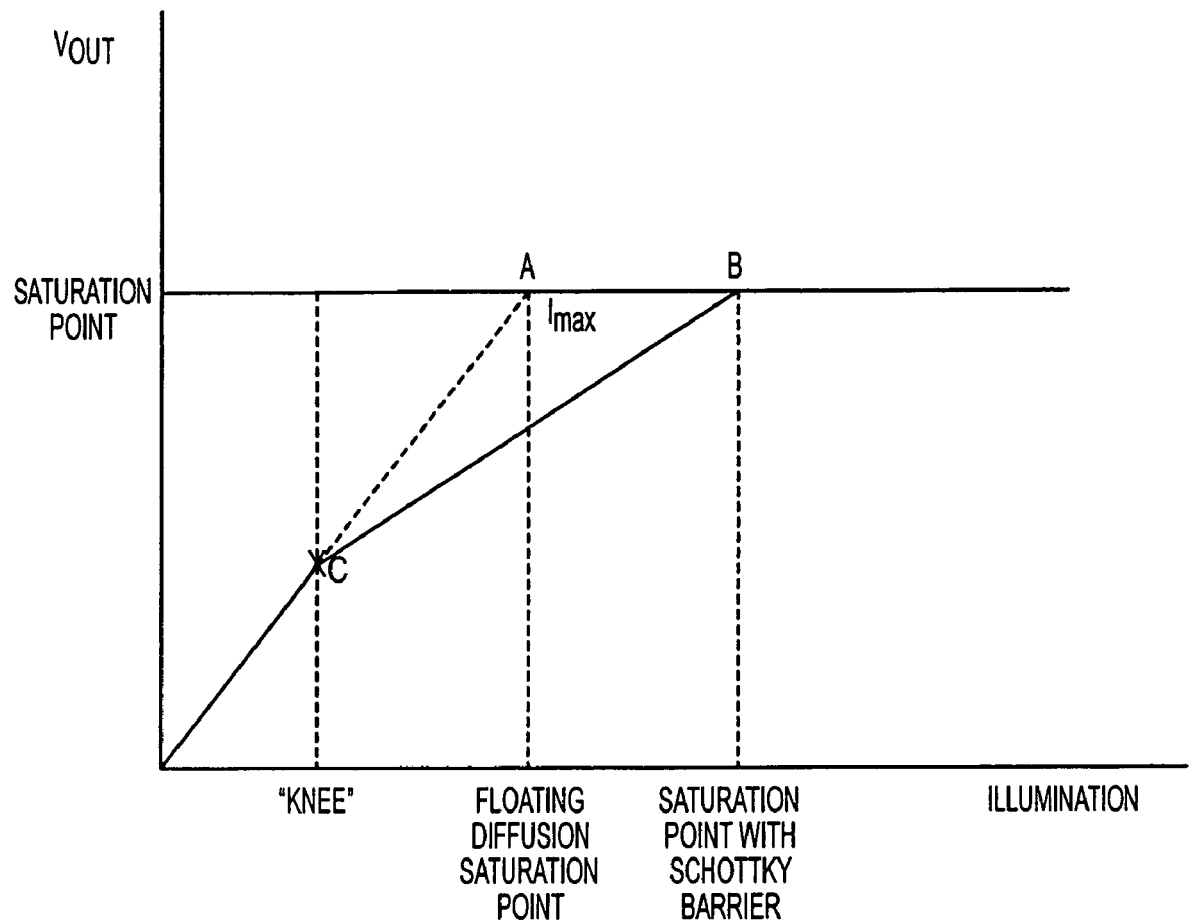
FIG. 5 illustrates an exemplary illumination versus voltage graph in accordance with an embodiment of the invention.

Thus, the Schottky contact 32 electrically allows for the realization of an automatic dual conversion gain pixel. The source follower transistor 18 converts the charge at the floating diffusion region 30 into an electrical output voltage. The ohmic contact 34, which connects the gate of the source follower transistor 18 to the floating diffusion region 30, lowers the barrier potential at the gate of the source follower transistor and allows the source follower transistor 18 to capture the full extent of the voltage swing produced by charges stored at the floating diffusion region 30 and in the capacitor C1 when the Schottky diode 32 couples the capacitor C1 to the floating diffusion region 30. Thus, the knee in the illumination versus output voltage produced by the Schottky contact 32, as shown in FIG. 5, can be purposely reflected in the output voltage of the source follower transistor 18 due to the ohmic contact 34.

The target barrier height of the Schottky diode 32 is selected based on where it is determined that the knee response is best based on the particular application. The knee point is the point at which the gain for the conversion gain of the proposed dual conversion gain pixel changes from high conversion gain (needed for low signal level), to low conversion gain (needed for high signal level). For example, if the point of saturation is 1.0 V on the floating diffusion region 30, and the knee is desired at 0.4 V, the Schottky diode barrier height is targeted at 0.4V. The knee can be expressed as a fraction of the saturation signal.

The target barrier height of the Schottky diode 32 is selected based on where it is determined that the knee response is best based on the particular application. The knee point is the point at which the dual conversion of the proposed dual conversion gain pixel changes from high conversion gain (needed for low signal level), to low conversion gain (needed for high signal level). For example, if the point of saturation is 1.0 V on the floating diffusion region 30, and the knee is desired at 0.4 V, the Schottky diode barrier height is targeted at 0.4V. The knee can be expressed as a fraction of the saturation signal.

Figure 6:
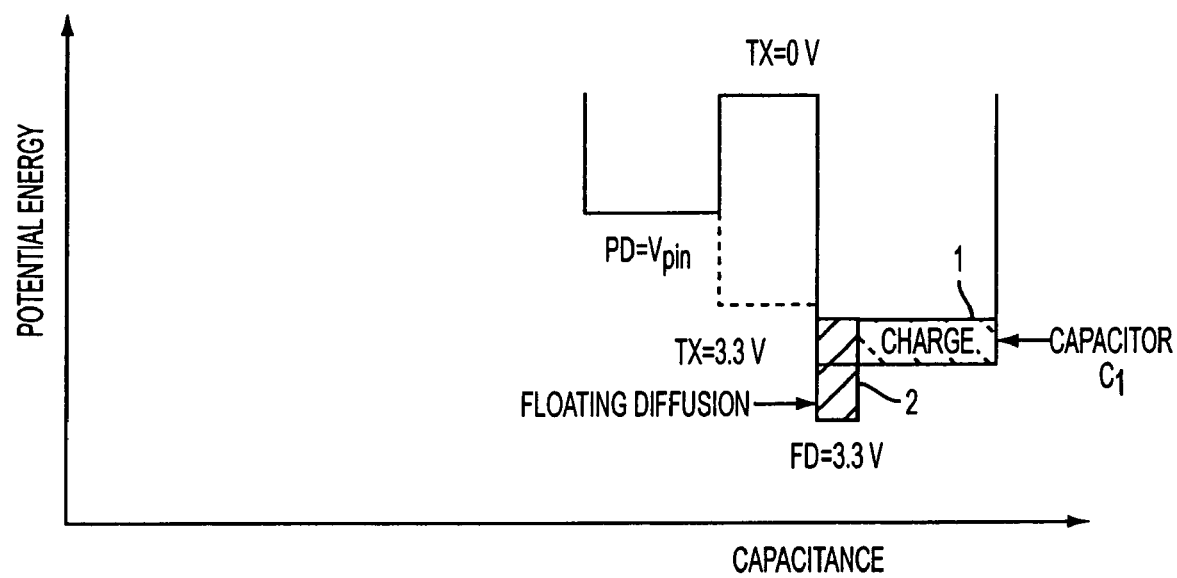
FIG. 6 is a potential diagram illustrating the operation of the FIG. 4 pixel.

FIG. 6 illustrates an exemplary potential energy versus capacitance graph for the pixel 110 of FIG. 4. As charge is collected in the photodiode PD it reaches its maximum collection point at a pinning voltage Vpin. When the transfer transistor is activated, the charge is transferred to the floating diffusion region 30. The amount of charge that the floating diffusion region 30 alone can hold is illustrated by section 2. With the addition of the Schottky diode 32 and the capacitor C1, additional charge may be collected as illustrated by section 1.

Figure 8:
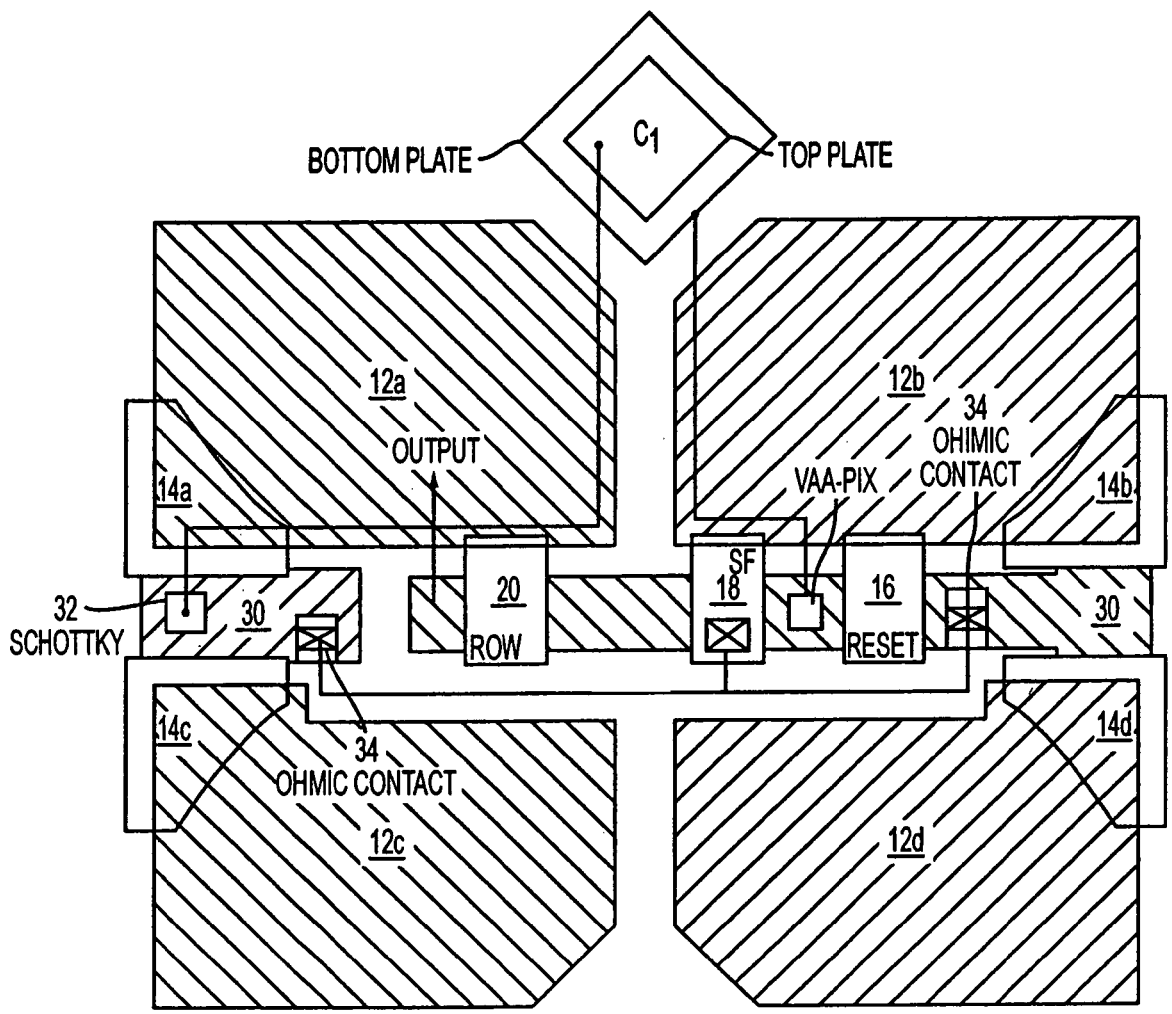
FIG. 8 illustrates an exemplary top-down view of a 4-way shared pixel implementation according to an exemplary embodiment of the invention.

The above described Schottky diode 32 and ohmic contact may also be implemented in a shared pixel arrangement, as illustrated in FIG. 8. FIG. 8 illustrates a top down view of a 4-way shared pixel implementation. The photosensors 12a, 12b, 12c, 12d each have a corresponding transfer transistor 14a, 14b, 14c, 14d which transfers charge to the floating diffusion region 30. The photosensors 12a, 12b, 12c, 12d share a reset transistor 16, a source follower transistor 18, a row select transistor 20, a floating diffusion region 30 and capacitor C1. Although FIG. 8 illustrates a 4-way shared implementation, the Schottky diode 32 and ohmic contact 34 described above may be implemented with other shared pixel or non-shared pixel arrangements.

Figure 9:
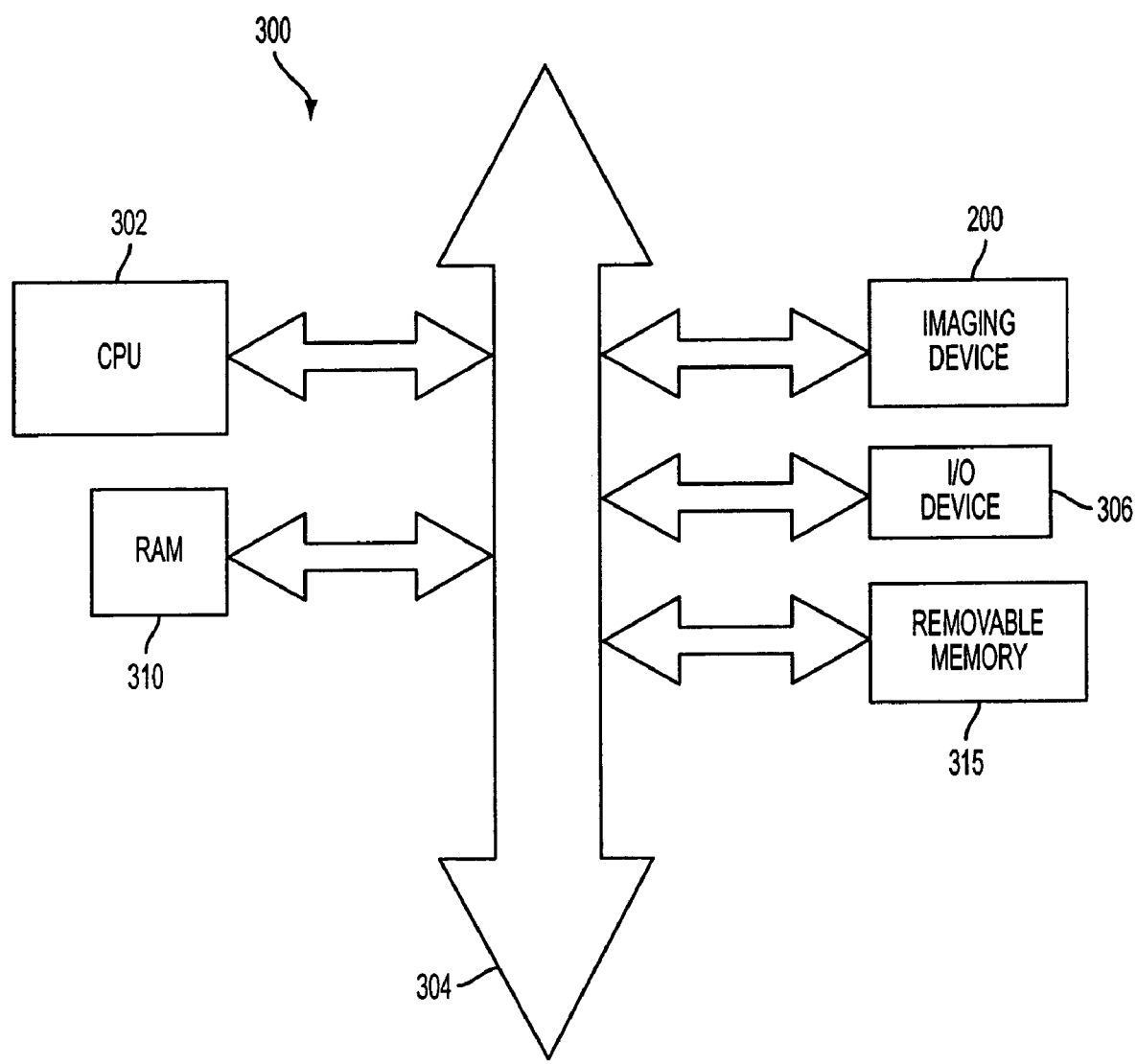
FIG. 9 illustrates a processor system incorporating at least one imager device in accordance with an embodiment of the invention.

FIG. 9 shows system 300, a typical processor system modified to include an imaging device 200 containing the pixel 110 of the invention. Imaging device 200 is similar to device 308 (FIG. 2) with the exception that the array 240 comprises pixels 110 constructed in accordance with the invention. The processor-based system 300 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

System 300, for example a camera system, generally comprises a central processing unit (CPU) 302, such as a microprocessor, that communicates with an input/output (I/O) device 306 over a bus 304. Imaging device 200 also communicates with the CPU 302 over the bus 304. The processor-based system 300 also includes random access memory (RAM) 310, and can include removable memory 315, such as flash memory, which also communicate with the CPU 302 over the bus 304. The imaging device 200 may be combined with a processor, such as a CPU, digital signal processor, or microprocessor, with or without memory storage on a single integrated circuit or on a different chip than the processor.

Figure 2:
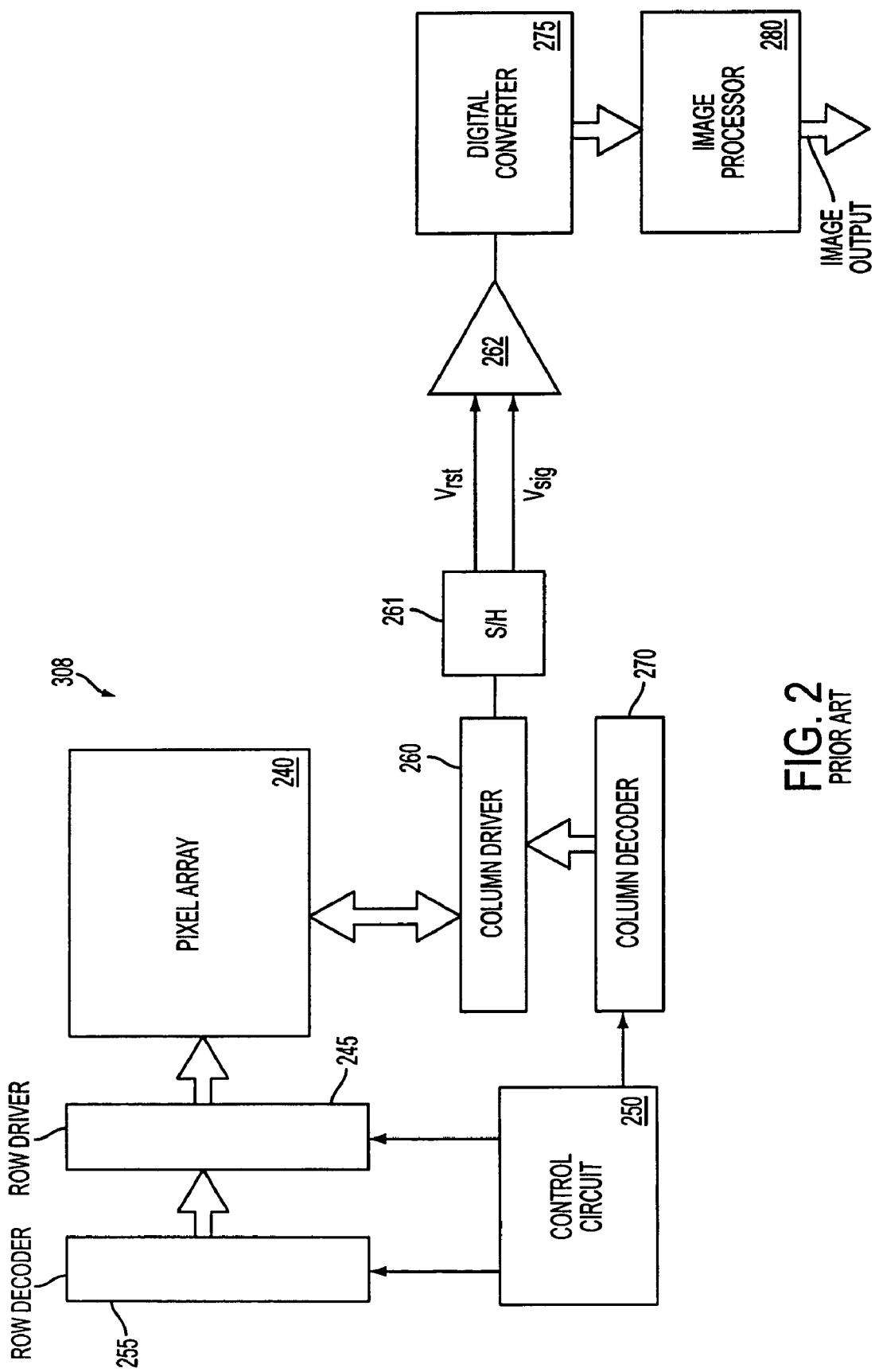
FIG. 2 is a block diagram of an imaging device.

The above described embodiments may be implemented in a manner similar to the imager device illustrated in FIG. 2. The pixel array 240, of FIG. 2, may be comprised of the above described pixels 110 having a Schottky diode 32 and ohmic contact 34.

It should be appreciated that other embodiments of the invention include a method of fabricating the circuits of the invention as illustrated in FIG. 4. For example, in one exemplary embodiment, a method of fabricating a dual conversion gain pixel comprises the acts of fabricating a photosensitive region within a substrate, forming a first transistor within the substrate for resetting the pixel, providing a floating diffusion region within said substrate, the floating diffusion region having a first capacitance, providing a second transistor between the photosensitive region and the floating diffusion region, the second transistor being controllable to transfer charge from the photosensitive region to the floating diffusion region, forming a capacitive element over the substrate; and forming a Schottky diode within and above the substrate, wherein the diode is connected between the diffusion region and the capacitive element such that when the diode is activated, a capacitance of the capacitive element is added to the first capacitance of the floating diffusion region.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

The invention claimed is:

1. A method of operating an imager device, said method comprising the acts of:
   transferring photo-generated charge to a diffusion region;
   activating a Schottky diode to control a conversion gain of the diffusion region when the amount of charge present in the diffusion region exceeds a threshold potential of the Schottky diode; and
   outputting a signal indicative of the charge in the diffusion region.

2. The method according to claim 1, further comprising the act of collecting charge transferred to said diffusion region in a storage element connected to said activated diode.

3. The method according to claim 1, further comprising the act of converting the charge from said diffusion region to an output signal by a circuit connected to said diffusion region by an ohmic contact.

4. The method of claim 1, wherein said charge is passed from a first portion of said diffusion region to a second portion of said diffusion region via a reverse leakage current of said Schottky diode and returned from said second portion of said diffusion region to said first portion of said diffusion region via a favored forward current of said Schottky diode.

5. A method of operating an imager device, said method comprising:
   providing a photosensor;
   providing a diffusion region having a first charge storage capacitance;
   storing photo-generated charge from the photosensor in the diffusion region; and
   controlling the storage capacitance of the diffusion region based on whether the level of charge stored in said diffusion region has reached a predetermined value.

6. The method of claim 5, wherein said act of controlling the storage capacitance is performed by causing charge to flow through a Schottky diode to a capacitive element.

7. The method of claim 5, wherein the predetermined value corresponds to a threshold potential of a Schottky diode connected to the diffusion region.

8. The method of claim 5 further comprising the act of converting the charge from said diffusion region to an output signal by a transistor having a gate connected to said diffusion region through an ohmic contact.

9. The method of claim 5, wherein said charge is passed from a first portion of said diffusion region to a second portion of said diffusion region via a reverse leakage current of a Schottky diode and returned from said second portion of said diffusion region to said first portion of said diffusion region via a favored forward current of a Schottky diode.

10. A method of fabricating a dual conversion gain pixel, said method comprising the steps of:
    fabricating a photosensitive region;
    forming a first transistor within the substrate for resetting the pixel;

providing a diffusion region, the diffusion region having a first associated conversion gain;

providing a second transistor between the photosensitive region and the diffusion region, the second transistor for transferring charge collected in the photosensitive region to the diffusion region; and forming a Schottky diode for switchably connecting said diffusion region with a capacitive element to provide said diffusion region with a second associated conversion gain when the level of charge accumulated in said diffusion region reaches a threshold potential of said Schottky diode.

11. The method of claim 10, wherein said diffusion region is an n– region and said Schottky contact includes least one conductive layer in contact with said n– diffusion region.

12. The method of claim 10, wherein said Schottky diode is configured to pass said charge from said diffusion region to said capacitive element via a reverse leakage current and to return said charge from said capacitive element to said diffusion region via a favored forward current.

* * * * *

UNITED STATES PATENT AND TRADEMARK OFFICE
CERTIFICATE OF CORRECTION

PATENT NO.       : 7,718,459 B2
APPLICATION NO.  : 11/106466
DATED            : May 18, 2010
INVENTOR(S)      : Inna Patrick et al.

It is certified that error appears in the above-identified patent and that said Letters Patent is hereby corrected as shown below:

In the Drawings:

Figure 8, "OHIMIC CONTACT" in the upper right-hand corner should read --OHMIC CONTACT--.

In the Specification:

Column 1, lines 20-21, "accumulating photo-generated charge a portion of the substrate" should read --accumulating photo-generated charge in a portion of the substrate--.

Column 2, lines 52-65 should be deleted in their entirety.

Column 4, lines 39-40, "transferred to the floating diffusion region 30 cause by relatively lower levels" should read --transferred to the floating diffusion region 30 caused by relatively lower levels--.

Column 5, lines 3-5, "The Schottky contact 32, forming a Schottky diode, is connect to the floating diffusion region 30" should read --The Schottky contact 32, forming a Schottky diode, is connected to the floating diffusion region 30--.

Column 5, after the paragraph ending at line 9 and before the paragraph beginning at line 10, the following paragraph should be inserted:

--As mentioned above, a low resistance ohmic contact 34 is formed with the floating diffusion region 30, as illustrated in FIG. 4. To form the contact 34, a small n+ region is formed in the floating diffusion region 30 which is doped n- elsewhere. The ohmic contact 34 creates a buffer between the gate of the source follower transistor 18 and the floating diffusion region 30. An exemplary doping level of the ohmic contact 34 is between $1e \times 10^{14}$ - $4e \times 10^{15}$ atoms per $cm^3$ and is preferably $2e \times 10^{15}$ atoms per $cm^3$. The low resistance ohmic contact 34 lowers the gate barrier of the source follower transistor and permits the effects of the Schottky diode 32 to be seen at the output of the source follower transistor 18.--

Signed and Sealed this

Fourteenth Day of September, 2010

David J. Kappos
*Director of the United States Patent and Trademark Office*

CERTIFICATE OF CORRECTION (continued)
U.S. Pat. No. 7,718,459 B2

Column 5, lines 40-67 should be deleted in their entirety.

Figure 3:
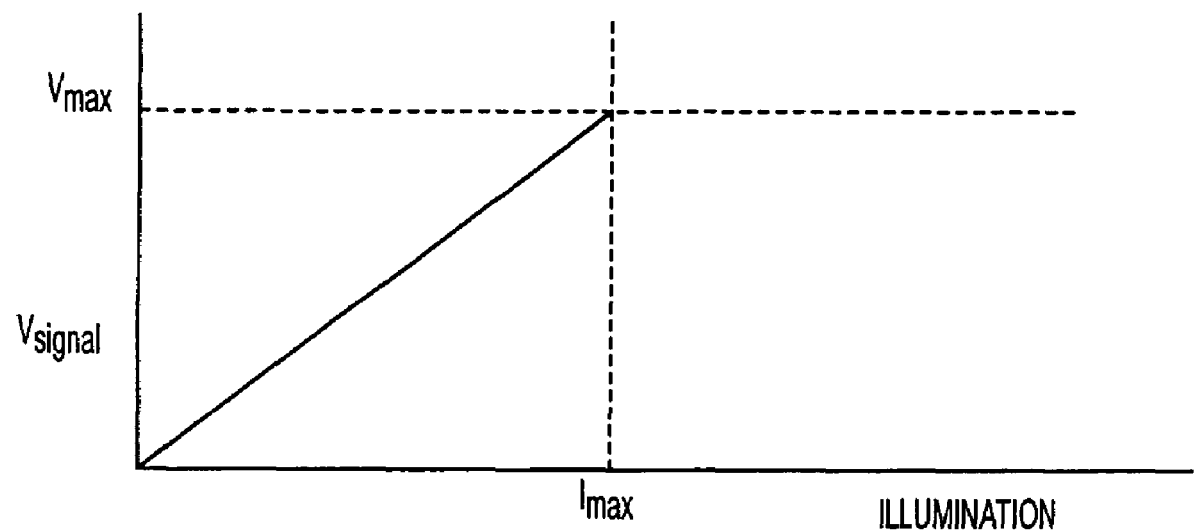
FIG. 3 illustrates an exemplary luminescence versus voltage graph for the pixel of FIG. 1.

Column 6, after the paragraph ending at line 45 and before the paragraph beginning at line 46, the following paragraph should be inserted:

--FIG. 5 illustrates an exemplary pixel illumination versus output voltage graph in accordance with the invention. The term knee reflects the fact that the graph creates an angle in the illumination-voltage profile, such that the maximum saturation voltage is reached at a greater level of illumination, point B, than that prior art pixel, point A, as illustrated in FIG. 3. For example, in FIG. 5, the illumination-voltage profile continues at an angle until the threshold voltage of the diode 32 is met. Once the threshold voltage of the diode is met, the knee is created, point C, and a new illumination-voltage profile angle is created. As illustrated, point B on the chart is the illumination-voltage point at which saturation occurs when realizing the dual conversion gain, whereas the saturation point would be at point A for an implementation not realizing the dual conversion gain aspects of the invention.--.

Column 6, lines 57-67 should be deleted in their entirety.

Column 7, before the paragraph beginning at line 1, the following paragraph should be inserted:

--From a cost effectiveness point of view, the current W/TiN/Ti contact process may be used and the intrinsic Schottky diode 32 may be adjusted by implantation. For example in FIG. 4, the Schottky diode 32 may be formed of a Ti layer 36 which is in direct contact with the n- floating diffusion region 30, a TiN barrier layer 38 is formed on top of the Ti layer 36 and a W layer 40 formed on top of the TiN layer 38. The instrinsic Schottky diode 32 barrier height is due to the difference in the workfunction and can be further adjusted by adding n-type or p-type doping to silicon in the contact region. Therefore, the final diode 32 barrier height will depend on the material selection and annealing and implantation conditions.--.

In the Claims:

Column 10, line 2, "said Schottky contact includes least one" should read --said Schottky contact includes at least one--.